United States Patent
Agarwala et al.

(10) Patent No.: US 9,448,927 B1
(45) Date of Patent: Sep. 20, 2016

(54) SYSTEM AND METHODS FOR REMOVING OBSOLETE DATA IN A DISTRIBUTED SYSTEM OF HYBRID STORAGE AND COMPUTE NODES

(71) Applicant: Springpath, Inc., Sunnyvale, CA (US)

(72) Inventors: Sandip Agarwala, Cupertino, CA (US); Shravan Gaonkar, Gainsville, FL (US); Mallikarjunan Mahalingam, Cupertino, CA (US); Smit Shah, Sunnyvale, CA (US); Faraz Shaikh, Sunnyvale, CA (US); Praveen Vegulla, Cupertino, CA (US); Krishna Yadappanavar, Sunnyvale, CA (US)

(73) Assignee: Springpath, Inc., Sunnyvale, CA (US)

( * ) Notice: Subject to any disclaimer, the term of this patent is extended or adjusted under 35 U.S.C. 154(b) by 89 days.

(21) Appl. No.: 14/135,499

(22) Filed: Dec. 19, 2013

Related U.S. Application Data

(60) Provisional application No. 61/739,685, filed on Dec. 19, 2012.

(51) Int. Cl.
  *G06F 17/30* (2006.01)
  *G06F 12/02* (2006.01)

(52) U.S. Cl.
  CPC .................. *G06F 12/0253* (2013.01)

(58) Field of Classification Search
  CPC .................. G06F 17/30067; G06F 17/30286; G06F 12/0253; G06F 12/0269; H03M 7/30
  USPC ....... 707/687, 688, 689, 692, 693, 700, 812, 707/813, 817
  See application file for complete search history.

(56) References Cited

U.S. PATENT DOCUMENTS

| | | |
|---|---|---|
| 5,692,185 A * | 11/1997 | Nilsen ................. G06F 12/0269 707/814 |
| 6,247,139 B1 | 6/2001 | Walker et al. |
| 6,338,117 B1 | 1/2002 | Challenger |
| 6,928,526 B1 | 8/2005 | Zhu et al. |
| 7,065,619 B1 | 6/2006 | Zhu et al. |
| 7,194,492 B2 | 3/2007 | Seidenberg |

(Continued)

OTHER PUBLICATIONS

Shaoshan Liu et al., Parker: Parallel Garbage Collerctor Based on Virtual Spaces, Computers, IEEE Transactions on Year: 2012, vol. 6, Issue: 11, pp. 1611-1623, DOI: 10.1109/TC.2011.193.*

(Continued)

*Primary Examiner* — Greta Robinson
(74) *Attorney, Agent, or Firm* — Blakely, Sokoloff, Taylor & Zafman LLP

(57) ABSTRACT

A distributed garbage collection in a distributed storage system is described, where the storage controller functions of the distributed storage system are separated from that of distributed storage system storage media. In an exemplary embodiment, a storage controller server generates a live object map of live objects stored on the distributed storage system in a plurality of block segments distributed across a plurality of storage controller servers. The storage controller server further scans the plurality of block segments to generate segment summary statistics, where the segment summary statistics indicates the number of live objects stored in the plurality of block segments. In addition, the storage controller server compacts each of the plurality of block segments that have a low utilization based on the segment summary statistics. Furthermore, the live object map is a probabilistic data structure storing a list of valid objects.

20 Claims, 12 Drawing Sheets

(56) References Cited

U.S. PATENT DOCUMENTS

| | | | |
|---|---|---|---|
| 7,246,211 B1 | 7/2007 | Beloussov | |
| 7,395,378 B1 | 7/2008 | Pendharkar | |
| 7,467,265 B1 | 12/2008 | Tawri | |
| 7,584,338 B1 | 9/2009 | Bricker et al. | |
| 7,757,202 B2 * | 7/2010 | Dahlstedt | G06F 12/0253 707/813 |
| 7,953,774 B2 | 5/2011 | Cong | |
| 8,190,823 B2 | 5/2012 | Waltermann | |
| 8,429,162 B1 | 4/2013 | Wang et al. | |
| 8,589,640 B2 | 11/2013 | Colgrove | |
| 8,768,977 B2 | 7/2014 | Golab | |
| 8,935,302 B2 * | 1/2015 | Flynn | G06F 3/0616 707/610 |
| 9,098,201 B2 | 8/2015 | Benjamin | |
| 9,110,792 B1 * | 8/2015 | Douglis | G06F 12/0269 |
| 9,201,794 B2 | 12/2015 | Gill | |
| 9,251,021 B2 | 2/2016 | Calder et al. | |
| 2001/0052073 A1 | 12/2001 | Kern et al. | |
| 2003/0014599 A1 | 1/2003 | McBreatry et al. | |
| 2003/0189930 A1 | 10/2003 | Terrell et al. | |
| 2004/0098424 A1 | 5/2004 | Seidenberg | |
| 2005/0114402 A1 | 5/2005 | Guthrie | |
| 2005/0193272 A1 | 9/2005 | Stager | |
| 2005/0268054 A1 | 12/2005 | Werner et al. | |
| 2008/0109624 A1 | 5/2008 | Gilbert | |
| 2009/0292746 A1 | 11/2009 | Bricker et al. | |
| 2010/0070715 A1 | 3/2010 | Waltermann | |
| 2010/0082550 A1 | 4/2010 | Cong | |
| 2010/0191783 A1 | 7/2010 | Mason | |
| 2010/0198795 A1 | 8/2010 | Chen | |
| 2011/0196900 A1 * | 8/2011 | Drobychev | G06F 17/30082 707/812 |
| 2011/0225214 A1 * | 9/2011 | Guo | G06F 3/0608 707/813 |
| 2011/0258480 A1 | 10/2011 | Young et al. | |
| 2011/0282842 A1 | 11/2011 | Popovski | |
| 2012/0047111 A1 | 2/2012 | Hayden | |
| 2012/0210095 A1 * | 8/2012 | Nellans | G06F 12/1072 711/206 |
| 2012/0278512 A1 | 11/2012 | Alatorre et al. | |
| 2012/0297142 A1 | 11/2012 | Gill | |
| 2012/0303577 A1 | 11/2012 | Calder | |
| 2012/0331249 A1 | 12/2012 | Benjamin | |
| 2013/0097380 A1 | 4/2013 | Colgrove | |
| 2013/0297569 A1 | 11/2013 | Hyde, II | |
| 2014/0040199 A1 | 2/2014 | Golab | |
| 2014/0122795 A1 | 5/2014 | Chambliss | |
| 2015/0039717 A1 | 2/2015 | Chiu et al. | |

OTHER PUBLICATIONS

"The Case for Persistent Full Clones," Deepstorage.net, http://getgreenbytes.com/wp-content/uploads/2013/05/Full_Clone_Persistent_VDI-Final.pdf, 18 pages.

Rodeh, Ohad, "B-trees, Shadowing, and Clones," *ACM Transactions on Storage (TOS)* 3, No. 4, https://www.usenix.org/legacy/events/lsf07/tech/rodeh.pdf, (2008), 51 pages.

Rodeh, Ohad, "B-trees, Shadowing, and Clones," *ACM Transactions on Computational Logic*, vol. V, No. N, (Aug. 2007), 26 pages.

Benjamin Zhu, Kai Lai, Hugo Patterson, "Avoiding the Disk Bottleneck in the Data Domain Deduplication File System", http://usenix.org/legacy/events/fast08/tech/full_papers/zhu/zh_html/index . . . USENIX Fast 2008, Feb. 2008, 16 pages.

VMWare Virtual SAN Hardware Guidance—VMWare, Jun. 2009 https://www.vmware.com/files/pdf/products/vsan/VMware-TMD-Virtual-SAN-Hardware-Guidance.pdf.

Giuseppe Decandia et al., Dynamo: Amazon's Highly Available Key-value Store, http://www.allthingsdistributed.com/files/amazon-dynamo-sosp2007.pdf, SOSP'07, Oct. 14-17, 2007, pp. 205-220, Stevenson, Washington, USA, Amazon.com.

Avinash Lakshman et al.,Cassandra—A Decentralized Structured Storage System, http://www.cs.cornell.edu/projects/ladis2009/, Oct. 10, 2009, 6 pages.

John S. Heidemann et al., File-System Development With Stackable Layers, https://www.ece.cmu.edu/~ganger/712.fall02/papers/stackableFS-Heidemann94.pdf, ACM Transactions on Computer Systems, vol. 12, No. 1 Feb. 1994 pp. 58-89.

* cited by examiner

SYSTEM AND METHODS FOR REMOVING OBSOLETE DATA IN A DISTRIBUTED SYSTEM OF HYBRID STORAGE AND COMPUTE NODES

RELATED APPLICATIONS

Applicant claims the benefit of priority of prior, provisional application Ser. No. 61/739,685, filed Dec. 19, 2012, the entirety of which is incorporated by reference.

FIELD OF INVENTION

This invention relates generally to a storage system and more particularly to distributed garbage collection in a distributed storage system.

BACKGROUND OF THE INVENTION

Enterprise storage systems currently available are proprietary storage appliances that integrate the storage controller functions and the storage media into the same physical unit. This centralized model makes it harder to independently scale the storage systems' capacity, performance and cost. Users can get tied to one expensive appliance without the flexibility of adapting it to different application requirements that may change over time. For small and medium scale enterprise, this may require huge upfront capital cost. For larger enterprise datacenters, new storage appliances are added as the storage capacity and performance requirements increase. These operate in silos and impose significant management overheads.

These storage systems either build storage systems as in-place filesystem (where data being overwritten in place), log-structured (where data being written is redirected to a new location) or copy on write (where the data is written in place, but a copy of the original data is written to new location). In all of these approaches, cleaning of up data to reclaim space, that was generated either by invalidation of old data by new writes or user triggered deletes, poses a challenging problem.

In addition, storage systems build a reference counting mechanism to track data accessible by the user. Whenever a data block or segment reaches a reference count of 0, it becomes a viable candidate for reclamation. That approach is efficient on a single node where there is no requirement to coordinate the reference count on a datablock. However, this mechanism becomes a challenge in a distributed multi-node environment.

SUMMARY OF THE DESCRIPTION

A distributed garbage collection in a distributed storage system is described, where the storage controller functions of the distributed storage system are separated from that of distributed storage system storage media. In an exemplary embodiment, a storage controller server generates a live object map of live objects stored on the distributed storage system in a plurality of block segments distributed across a plurality of storage controller servers. The storage controller server further scans the plurality of block segments to generate segment summary statistics, where the segment summary statistics indicates the number of live objects stored in the plurality of block segments. In addition, the storage controller server compacts each of the plurality of block segments that have a low utilization based on the segment summary statistics. Furthermore, the live object map is a probabilistic data structure storing a list of valid objects.

Other methods and apparatuses are also described.

BRIEF DESCRIPTION OF THE DRAWINGS

The present invention is illustrated by way of example and not limitation in the figures of the accompanying drawings in which like references indicate similar elements.

DETAILED DESCRIPTION

Figure 1:
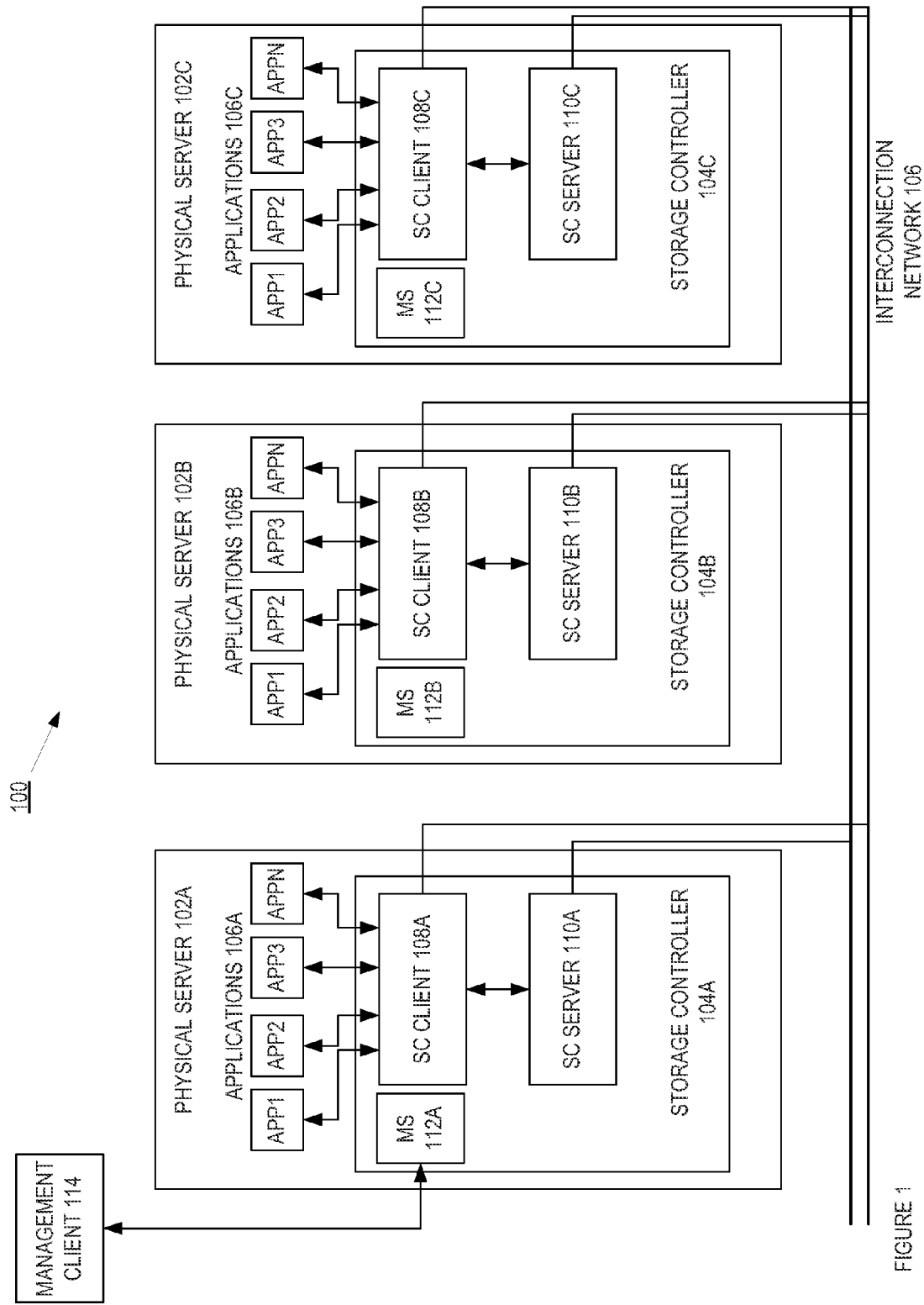
FIG. 1 is an illustration of one embodiment of a high-level view of StorFS system.

A distributed garbage collection in a distributed storage system is described, where the storage controller functions of the distributed storage system are separated from that of distributed storage system storage media. In the following description, numerous specific details are set forth to provide thorough explanation of embodiments of the present invention. It will be apparent, however, to one skilled in the art, that embodiments of the present invention may be practiced without these specific details. In other instances, well-known components, structures, and techniques have not been shown in detail in order not to obscure the understanding of this description.

Reference in the specification to "one embodiment" or "an embodiment" means that a particular feature, structure, or characteristic described in connection with the embodiment can be included in at least one embodiment of the invention. The appearances of the phrase "in one embodiment" in various places in the specification do not necessarily all refer to the same embodiment.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The processes depicted in the figures that follow, are performed by processing logic that comprises hardware (e.g., circuitry, dedicated logic, etc.), software (such as is run on a general-purpose computer system or a dedicated machine), or a combination of both. Although the processes are described below in terms of some sequential operations, it should be appreciated that some of the operations described may be performed in different order. Moreover, some operations may be performed in parallel rather than sequentially.

The terms "server," "client," and "device" are intended to refer generally to data processing systems rather than specifically to a particular form factor for the server, client, and/or device.

A distributed garbage collection in a distributed storage system is described, where the storage controller functions of the distributed storage system are separated from that of distributed storage system storage media. In one embodiment, the StorFS system writes incoming data to a new location on the persistent storage. This means that when an object or a logical offset within a file gets overwritten, the old object or file content needs to be removed (e.g. cleaned or garbage collected.) Because of this, the StorFS system needs to determine a list of valid (e.g., live) objects. Due to the presence of snapshots, clones and deduplication, multiple files, or file systems may reference the same data object. In one embodiment, the StorFS system traverses the metadata tree to compile a list of valid data objects, which form the leaf of the metadata tree. Because a cluster may contain billions of valid objects, this list can be gigantic and would not fit in the main memory.

To address this issue, and in one embodiment, the StorFS system uses a space-efficient probabilistic data structure to store the list of valid objects. In one embodiment, the space-efficient probabilistic data structure is space-efficient approximate membership data-structure such as bloom filter or quotient filter. For example and in one embodiment, a bloom filter can be used to store the list of valid objects. The bloom filter permits membership tests with very little memory compared to the number of object entries it stores. The garbage collection process involves generating a live object map, cleaning the segments, and compacting the segments. In one embodiment, the live object map generation includes traversing the metadata tree and populating the bloom filter. In one embodiment, cleaning the segments includes scanning the segments to check the number of live objects contained in the segments and generating a segment summary statistic. In one embodiment, compacting the segments includes compacting segments with low utilization based on segment summary statistics.

FIG. 1 is an illustration of one embodiment of a high-level view of StorFS system 100. In FIG. 1, the StorFS system 100 includes storage nodes 102A-C coupled by an interconnection network 116. While in one embodiment, three storage nodes 102A-C are illustrated as part of the StorFS system 100, in alternate embodiments, there can be more or less storage nodes. For example and in one embodiment, the StorFS system 100 can include up to several hundred storage nodes. In one embodiment, each storage node 102A-C includes a storage controller (SC) client (also called dispatcher) 108A-C, a storage controller (SC) server 110A-C, or both. The SC servers 110A-C manage their underlying storage (e.g., Hard disk drive (HDD), Solid state drives (SSD), PCIe flash, etc.) and collectively provide reliable and unified storage functionality to the SC clients. The SC client 108A-C processes input/output (I/O) requests from the applications that are local to its physical storage node and routes them to the appropriate SC servers for processing. For example and in one embodiment, SC client 108A can send an I/O request locally to SC Server 110A and/or remotely to SC Servers 110B or 110C. The system is capable of exposing many different interfaces to the application like file (e.g. NFS, CIFS), object, key-value, or another type of interface. In one embodiment, the storage node 102A-C can be server, blade server, personal computer, or any other type of device capable of storing data. In one embodiment, the management server 112A-C is an agent that is used to communicate system management data and commands regarding the corresponding storage node 102A-C with the management client 114.

In one embodiment, the design of the StorFS system 100 distributes both the data and the metadata, and this system 100 does not require storing a complete global map for locating individual data blocks in our system. The responsibility of managing metadata is offloaded to each individual storage nodes 102A-C. In one embodiment, a cluster manager (CRM) resides on each SC Server 110 maintains some global metadata, which is small compared to the local metadata. In one embodiment, each logical file (or entity) is partitioned into equal sized "stripe units". The location of a stripe unit is determined based on a mathematical placement function Equation (1):

$$\text{Virtual\_Node\#} = \text{Hash}(\text{Entity}_{Id}, \text{Stripe\_Unit\#})\%\text{Total\_Vitual\_Nodes} \quad (1)$$

$$\text{Stripe\_Unit\#} = \frac{\text{offset}}{\text{Stripe\_Unit\_Size}}\%\text{Stripe\_Unit\_Per\_Stripe}$$

The $\text{Entity}_{Id}$ is an identification of a storage entity that is to be operated upon, the Total_Virtual_Nodes is the total number of virtual nodes in the StorFS system 100, the offset is an offset into the storage entity, and the Stripe_Unit_Size is the size of each stripe unit in the StorFS system 100. The value Stripe_Unit_Per_Stripe is described further below. In one embodiment, the storage entity is data that is stored in the StorFS system 100. For example and in one embodiment, the storage entity could be a file, an object, key-value pair, etc. In this example, the $\text{Entity}_{Id}$ can be an iNode value, a file descriptor, an object identifier, key/value identifier, etc. In one embodiment, an input to a storage operation is the $\text{Entity}_{Id}$ and the offset (e.g., a write, read, query, create, delete, etc. operations). In this embodiment, the $\text{Entity}_{Id}$ is a globally unique identification.

In one embodiment, the StorFS 100 system receives the $\text{Entity}_{Id}$ and offset as input for each requested storage operation from an application 106A-C. In this embodiment, the StorFS system 100 uses the offset to compute a stripe unit number, Stripe_Unit#, based on the stripe unit size, Stripe_Unit_Size, and the number of virtual nodes that the entity can be spread across, Stripe_Unit_Per_Stripe. Using the stripe unit number and the entity identifier ($\text{Entity}_{Id}$), the StorFS system 100 computes the virtual node identifier. As described below, the StorFS system 100 uses a hash function to compute the virtual node identifier. With the virtual node identifier, the StorFS 100 can identify which physical node the storage entity is associated with and can route the request to the corresponding SC server 110A-C.

In one embodiment, each vNode is a collection of either one or more data or metadata objects. In one embodiment, the StorFS system 100 does not store data and metadata in the same virtual node. This is because data and metadata may have different access patterns and quality of service (QoS) requirements. In one embodiment, a vNode does not span across two devices (e.g. a HDD). A single storage disk of a storage node 102A-C may contain multiple vNodes. In one embodiment, the placement function uses that a deterministic hashing function and that has good uniformity over the total number of virtual nodes. A hashing function as known in the art can be used (e.g., Jenkins hash, murmur hash, etc.). In one embodiment, the "Stripe_Unit_Per_Stripe" attribute determines the number of total virtual nodes that an entity can be spread across. This enables distributing and parallelizing the workload across multiple storage nodes (e.g., multiple SC servers 110A-C). In one embodiment, the StorFS system 100 uses a two-level indexing scheme that maps the logical address (e.g. offset within a file or an object) to a virtual block address (VBA) and from the VBAs to physical block address (PBA). In one embodiment, the VBAs are prefixed by the ID of the vNode in which they are stored. This vNode identifier (ID) is used by the SC client and other StorFS system 100 components to route the I/O to the correct cluster node. The physical location on the disk is determined based on the second index, which is local to a physical node. In one embodiment, a VBA is unique across the StorFS cluster, where no two objects in the cluster will have the same VBA.

In one embodiment, the cluster manager (CRM) maintains a database of virtual node (vNode) to physical node (pNode) mapping. In this embodiment, each SC client and server caches the above mapping and computes the location of a particular data block using the above function in Equation (1). In this embodiment, the cluster manager need not be consulted for every I/O. Instead, the cluster manager is notified if there is any change in 'vNode' to 'pNode' mapping, which may happen due to node/disk failure, load balancing, etc. This allows the StorFS system to scale up and parallelize/distribute the workload to many different storage nodes. In addition, this provides a more deterministic routing behavior and quality of service. By distributing I/Os across different storage nodes, the workloads can take advantage of the caches in each of those nodes, thereby providing higher combined performance. Even if the application migrates (e.g. a virtual machine migrates in a virtualized environment), the routing logic can fetch the data from the appropriate storage nodes. Since the placement is done at the stripe unit granularity, access to data within a particular stripe unit goes to the same physical node. Access to two different stripe units may land in different physical nodes. The striping can be configured at different level (e.g. file, volume, etc.) Depending on the application settings, the size of a stripe unit can range from a few megabytes to a few hundred megabytes. In one embodiment, this can provide a good balance between fragmentation (for sequential file access) and load distribution.

Figure 2:
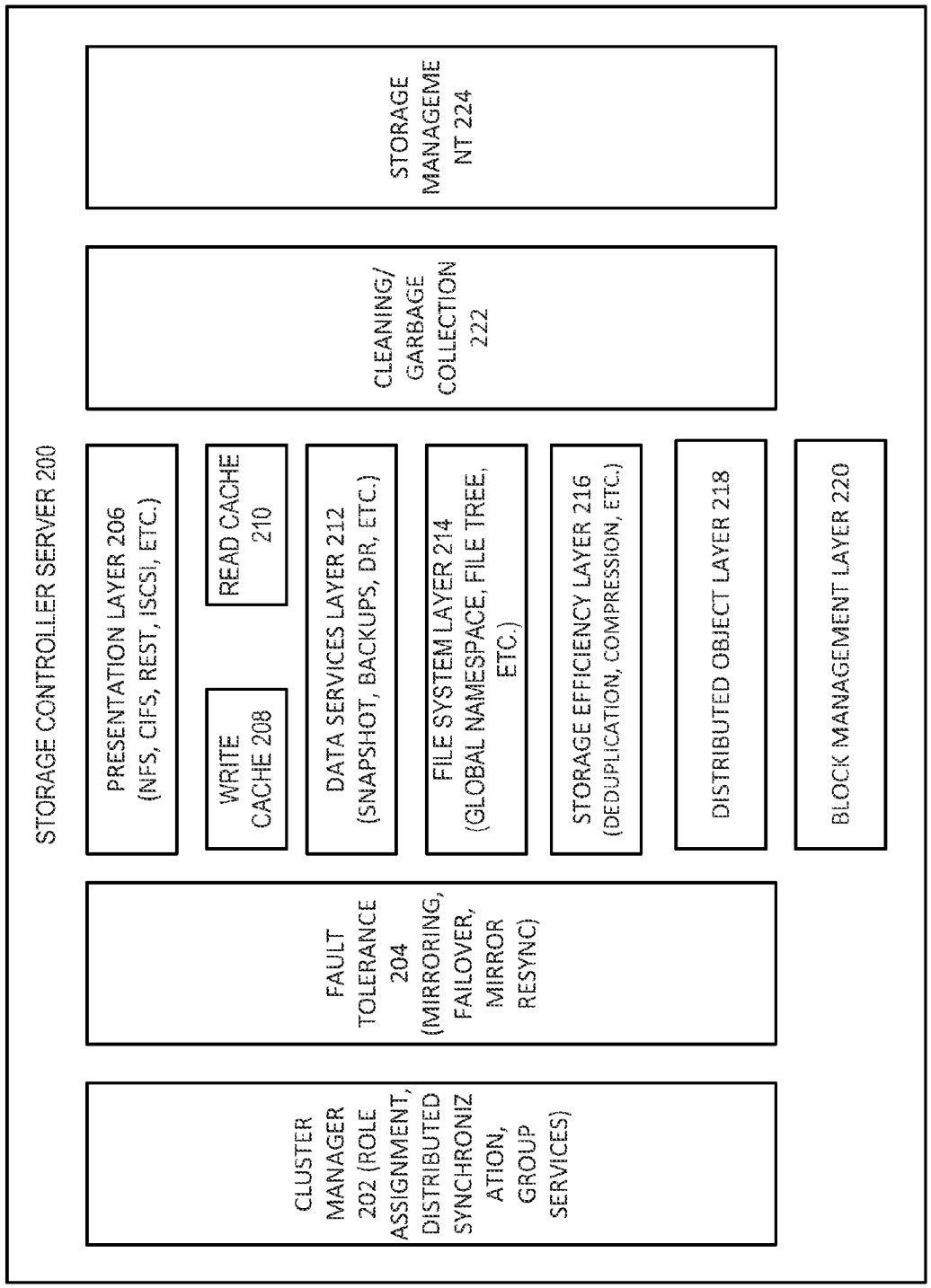
FIG. 2 is an illustration of one embodiment of a system including some of the components that comprises the storage controller server.

FIG. 2 is a block diagram of one embodiment of a storage control server 200. In one embodiment, the Block Management Layer 220 of the storage control server is responsible for formatting, allocating, and freeing storage in fixed block sizes. This layer provides access to different kinds of storage (e.g. SSD, HDD, etc.) in the system. In one embodiment, the Distributed Object Layer 218 of the storage control server uses an API of the Block Management Layer 220 to provide a global distributed object namespace that is accessible over the network. In one embodiment, the Storage Efficiency Layer 216 reduces the size of data footprint on the physical medium using techniques like compression, deduplication, etc. The reduction is achieved without deteriorating the performance or the reliability of the data storage. In one embodiment, the File System Layer 214 provides a logical global namespace abstraction to organize and locate data in the cluster. In one embodiment, the Data Service Layer 212 provides enterprise data services like disaster recovery, fine grained policy management, snapshots/clones, etc. In one embodiment, the Write Cache 208 and the Read Cache 210 Layers provide acceleration for write and read I/O respectively using fast storage devices. In one embodiment, the Write Cache Layer 208 includes the write log as described below. In one embodiment, the Presentation Layer 206 provides an interface to access the StorFS storage using well-known standard protocols like NFS, CIFS, REST, iSCSI, etc. In one embodiment, the Cluster Manager (CRM) Layer 202 is responsible for the coordination across distributed StorFS components, delegating responsibilities and maintaining a consistent global state of the system. In one embodiment, the Fault Tolerance Layer 204 is responsible for resiliency and making sure that the data is available and consistent even after the failure of a software or hardware component (disk, server, network, etc.). In one embodiment, the Garbage Collection Layer 222 is responsible for reclaiming dead space that result due to entities getting deleted or updated. This layer efficiently determines the storage blocks that are not used (or referenced) and makes them available for new data to be written. In one embodiment, the Storage Management Layer 224 provides a framework to configure, monitor, analyze and report on the operation of the overall StorFS cluster storage system as well as individual logical and physical entities in the cluster. In one embodiment, each of the layers mentioned above are fully distributed and each layer does not rely on any centralized components for their operations.

Figure 3A:
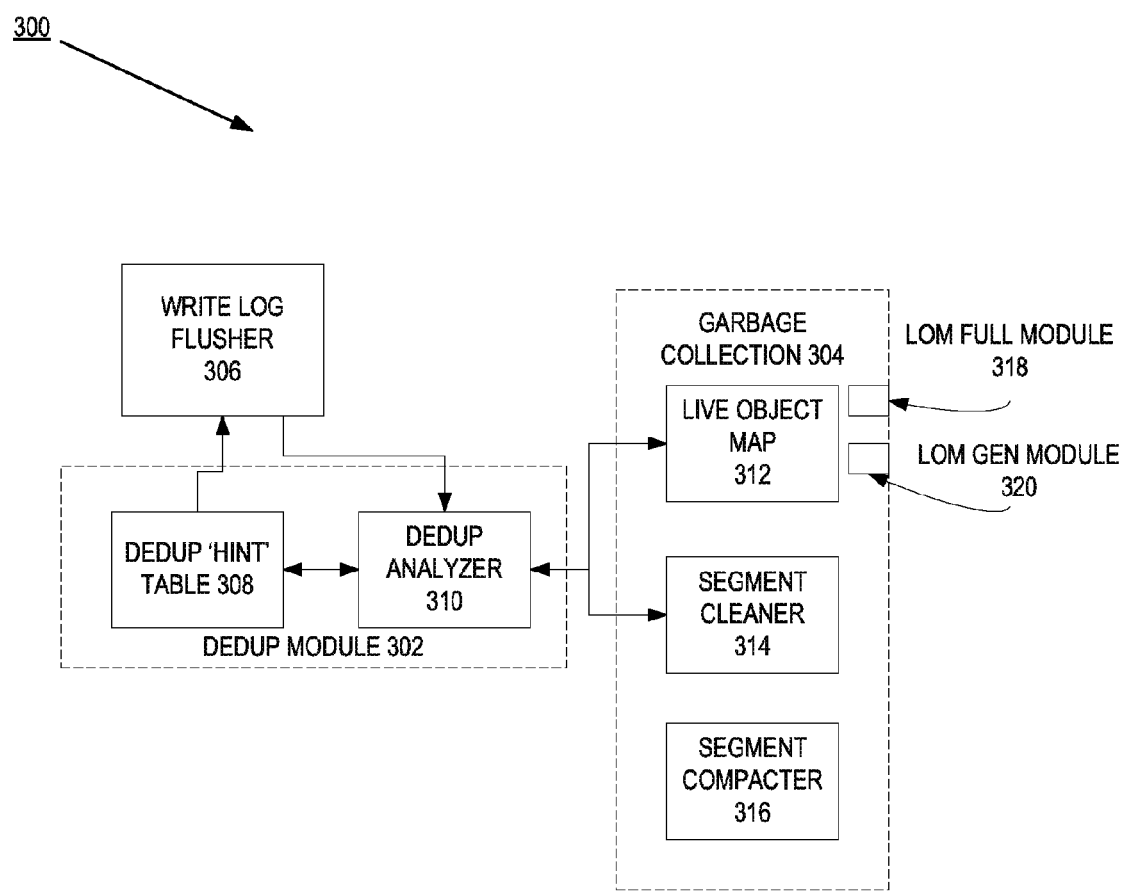
FIG. 3A is an illustration of one embodiment of a deduplication module.

FIG. 3A is an illustration of one embodiment of a deduplication module 302 and garbage collection module 304. In one embodiment, the deduplication analyzer 310 generates the deduplication hint table 308 by analyzing the streams of new objects that are written to the storage. In one embodiment, the hint table includes a 'content fingerprint' to the object's VBA. In this embodiment, a goal is to store a content fingerprint for those VBAs of those objects that are likely to be deduplicated. In one embodiment, one of the ways this can be achieved is by keeping track of top-K statistics for the objects. In one embodiment, the top-K statistic is a partial ordering method where the top K elements of the set are identified and ordered instead of ordering the entire set. For example, top 10 most sold cars make/model out of all types of cars are identified and sorted. In one embodiment, the StorFS system performs deduplication when the writelog flusher flushes data from fast storage to persistent storage so as to avoid storing duplicates to the persistent storage. In another embodiment, the StorFS system can perform deduplication at another step (e.g., upon initial storage).

In one embodiment, the garbage collection module includes a live object map 312, segment cleaner 314, and segment compactor 316. In one embodiment, the live object map 312 is a map of the live objects stored in the StorFS system. In one embodiment, the garbage collector 304 further includes live object map full module 318 that builds a full live object map as described in FIG. 4 below and a live object map generation 320 that updates the live object map 213 for a generation as described in FIG. 5 below. In one embodiment, the segment cleaner 314 scans the block segments to check the number of live objects they contain and generate a segment summary statistic. In one embodiment, the segment compactor 316 compacts segments whose utilization drops below a certain threshold.

In one embodiment, the StorFS system writes incoming data to a new location on the persistent storage. This means that when an object or a logical offset within a file gets overwritten, the old object or file content needs to be removed (e.g. cleaned or garbage collected.) Because of this, the StorFS system needs to determine a list of valid (e.g., live) objects. Due to the presence of snapshots, clones and deduplication, multiple files, or file systems may reference the same data object. In one embodiment, the StorFS system traverses the metadata tree to compile a list of valid data objects, which form the leaf of the metadata tree. Because a cluster may contain billions of valid objects, this list can be gigantic and would not fit in the main memory. To address this issue, the StorFS system uses a space-efficient probabilistic data structure to store the list of valid objects. For example and in one embodiment, a bloom filter can be used to store the list of valid objects. The bloom filter permits membership tests with very little memory compared to the number of object entries it stores. The garbage collection process involves generating a live object map, cleaning the segments, and compacting the segments. In one embodiment, the live object map generation includes traversing the metadata tree and populating the bloom filter. In one embodiment, cleaning the segments includes scanning the segments to check the number of live objects contained in the segments and generating a segment summary statistic. In one embodiment, compacting the segments includes compacting segments with low utilization based on segment summary statistics.

Figure 3B:
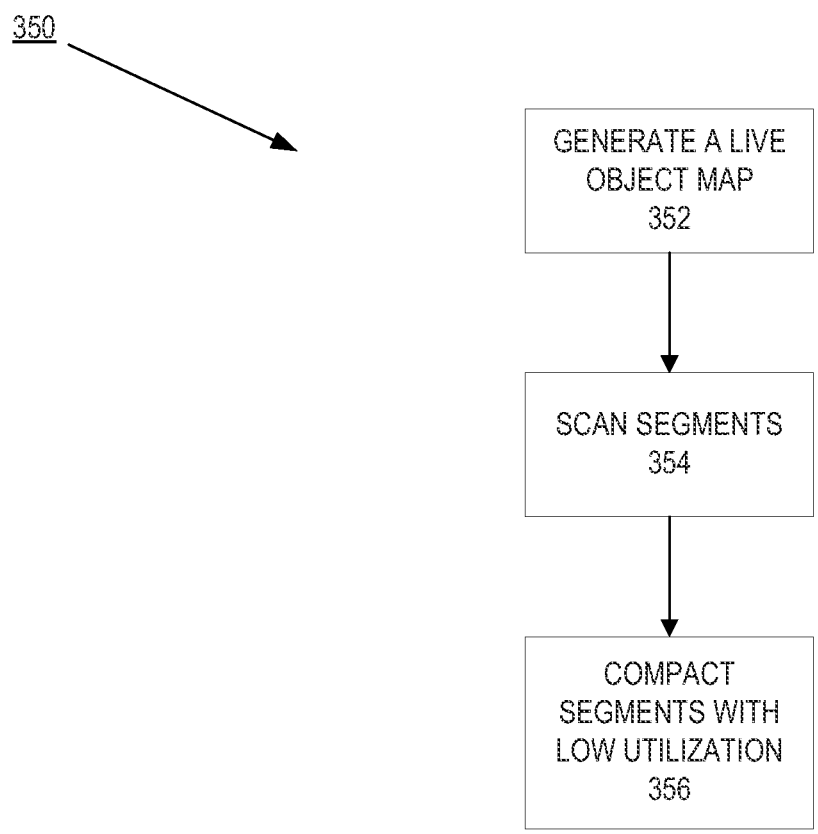
FIG. 3B is a flow diagram of one embodiment of a process to perform garbage collection in a distributed storage system.

FIG. 3B is a flow diagram of one embodiment of a process 350 to perform garbage collection in a distributed storage system. In one embodiment, a garbage collection module performs process 350 to garbage collect, such as the garbage collection module 304 as described in FIG. 3 above. In one embodiment, process 350 begins generating a live object map at block 352. In one embodiment, the live object map is a list of the live objects that are stored in the StorFS system. In one embodiment, the live object map is a space-efficient probabilistic data structure that stores the list of live objects. In one embodiment, process 350 generates the live object map by traversing the metadata tree and creating the live object map. Traversing the metadata tree and creating the live objet map is further described in FIGS. 4 and 5 below.

At block 354, process 350 scans the segments to check the number of live objects contained in the segments and generates a segment summary statistic. In one embodiment, once the live object map has been created, the process 350 scans the block segments to check the number of live objects they contain and generates a segment summary statistic of the utilization of the segments, (e.g. the ratio of number of the live-objects to the total number of objects in the segment). In one embodiment, the summary statistics can be built in two ways: (1) by a complete block segment scan and (2) using and in essential statistics update. In one embodiment, the complete block segment scan operates by having process 350 iterates over all the segments to check for valid objects. This approach can have more overhead because of a large number of I/Os the approach generates.

In one embodiment, in the incremental summary statistics update, process 350 uses the dead object hint log generated by the 'Write Log Flusher'. The objects in this log are tested for their membership in the live object map. If the test is negative, process 350 confirms that the object is actually dead. In addition, process 350 updates its segment summary statistics by decrementing the utilization.

Process 350 compacts the segments with low utilization at block 356. In one embodiment, compact segmentation compacts segments whose utilization drops below a certain threshold. In this embodiment, each segment can contain four types of entities: Live objects, dead objects, object tombstone entry, and segment tombstone entry. These entities are dealt as follows during compaction:
  Tombstone entries are discarded and need not be carried forward.
  Live objects are copy forwarded to the new segments and the corresponding index for that object is updated.
  A tombstone entry is added for each dead objects
  A segment tombstone is added for the segment being compacted.
Segment compaction if further described in FIG. 7 below.

In one embodiment, metadata traversal can cause a lot of random I/Os that can lead to very high overhead in HDD. File metadata, for example, is organized in a hierarchical tree format to locate data blocks on the persistent storage. In one embodiment, the StorFS system employs a smart traversal algorithm that efficiently reads the whole metadata tree with very little random I/O to the HDD. If there is sufficient space on the faster flash drive to hold the metadata vNode, the StorFS system copies the entire metadata vNode onto the faster flash drive. The random read I/Os during the traversal are sent to faster flash drives, which have much higher random read performance compared to HDD. In addition, the StorFS system caches the top few levels of the metadata tree in the DRAM to further expedite the tree traversal.

Figure 4:
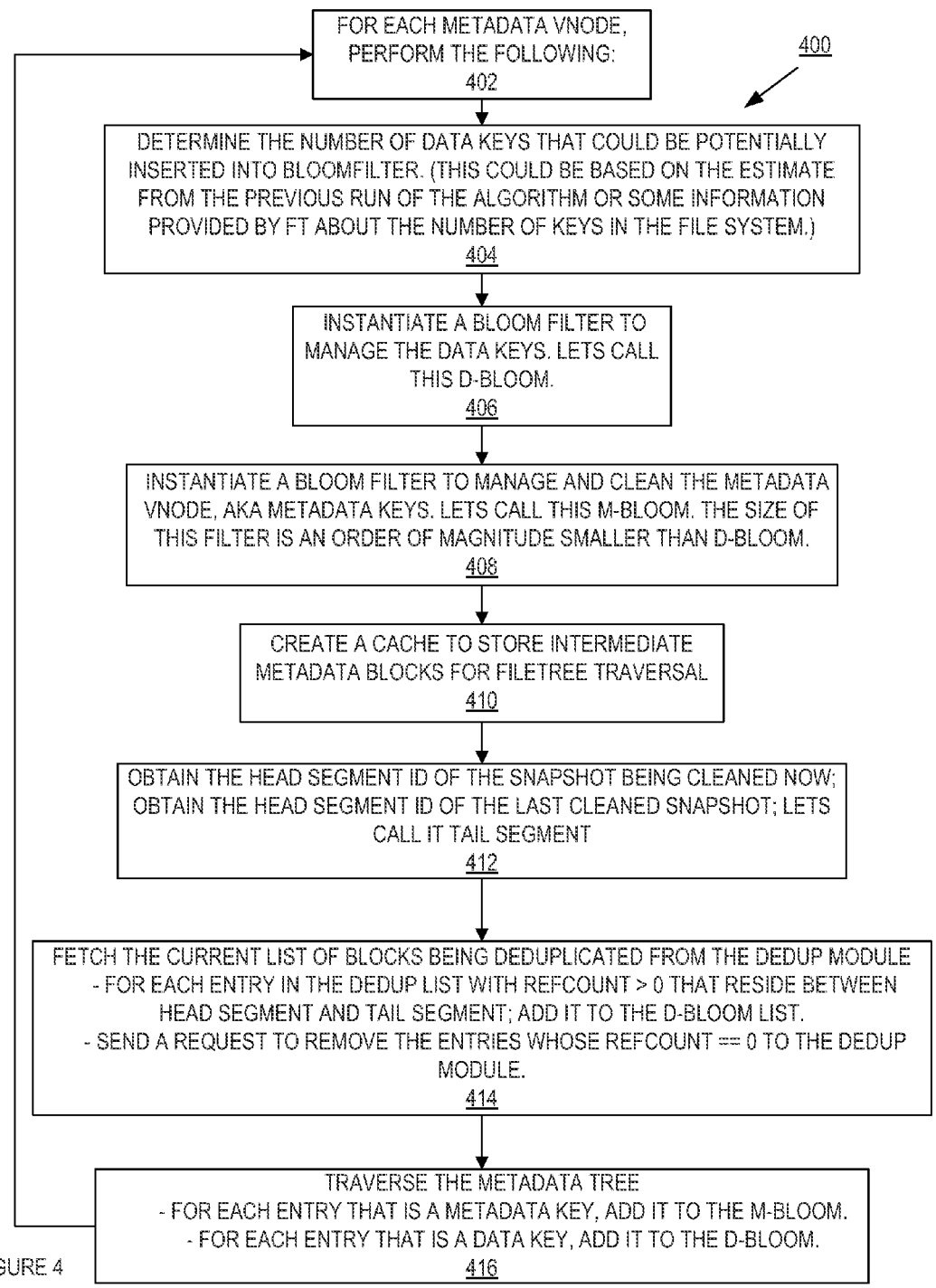
FIG. 4 is a flow diagram of one embodiment of a process to perform a full metadata tree walk for garbage collection.

The live object map can be generated for the complete metadata tree using the algorithm shown in FIG. 4. This makes sure that the live objects for the tree are captured in the corresponding bloom filter. FIG. 4 is a flow diagram of one embodiment of a process 400 to perform a full metadata tree walk for garbage collection. In one embodiment, this walk is performed by the garbage collection module 304 as shown in FIG. 3. In FIG. 4, process 400 begins by performing a processing loop (blocks 402-418) to perform the metadata tree walk for each metadata vNode. At block 404, process 400 determines the number of data keys that could be potentially inserted into a Bloom Filter. In one embodiment, the number of data keys that could be inserted could be based on an estimate from the previous run of the algorithm or some information provided by metadata file tree about the number of keys in the File System.

Process 400 instantiates a bloom filter to manage the data keys at block 406. In one embodiment, this bloom filter is called the D-Bloom. At block 408, process 400 instantiates a bloom filter to manage and clean the Metadata vNode, which are metadata keys. In one embodiment, this metadata bloom filter is called the M-bloom. In one embodiment, the size of the M-bloom is up to an order of magnitude smaller that the D-bloom bloom filter. In one embodiment, this bloom filter is a space-efficient probabilistic data structure that is used to test whether an object is a member of a live object map. Process 400 creates a cache to store intermediate metadata blocks for file tree traversal at block 410.

At block 412, process 400 obtains the head segment ID of the Snapshot being cleaned and the head segment ID of the last cleaned snapshot. The later is referred to as the tail segment. Process 400 fetches the current list of blocks being deduplicated from the deduplication module 602. In one embodiment, for each entry in the deduplication list with reference count greater than zero that reside between Head Segment and Tail Segment, process 400 adds this entry to the D-Bloom list. In addition, at block 414, process 400 removes those entries from the Deduplication Module whose reference count is equal to zero. For example and in one embodiment, the Deduplication Module is the Deduplication Module 302 as described in FIG. 3 above. In one embodiment, process 400 removes these entries by sending a request to the Deduplication module. At block 416, process 400 traverses the metadata tree. In one embodiment, process 400 traverses the metadata tree by for each entry that is a metadata key, adding it to the M-Bloom filter and for each entry that is a data key, adding it to the D-Bloom filter.

Figure 6:
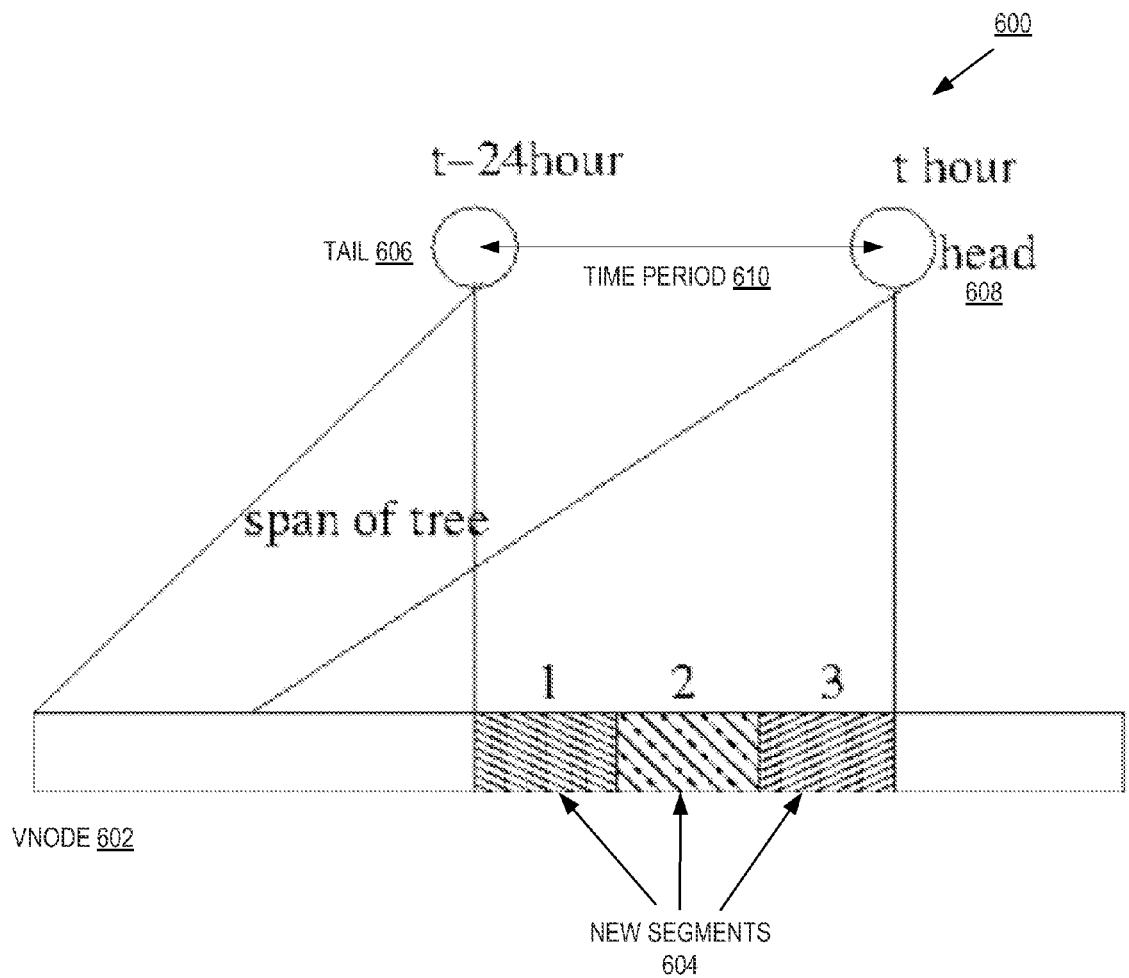
FIG. 6 is an illustration of one embodiment of a segment timeline.

In one embodiment, this complete metadata traversal, however, comes at a cost. In one embodiment, instead of walking the whole tree each time, StorFS implements an approach to incrementally clean the segments written in a particular time duration (e.g. in a day.) Consider the scenario as illustrated in FIG. 6 below, where the full filetree cleaner is executed at (t-24) hours. In one embodiment, the segments written between times (t-24) and (t) can be of three types: (i) Segments/objects that were compacted and moved by the segment cleaner; (ii) Segments/objects that were written because of the incoming writes from the client and are still valid; and (iii) Segments/objects that were written because of the incoming writes from the client, but were invalidated by subsequence writes in that time window.

FIG. 6 is an illustration of one embodiment of a segment timeline 600. In one embodiment, the segment timelines 600 illustrates the new segments 604 added to a vNode 602 over a time period 610. In one embodiment, the new segments 604 added in this time period are the segments analyzed for garbage collection as described in FIG. 3 above. In one embodiment, the StorFS system analyzes the segments added to a vNode between a tail 606 and head 608 over the time period 610 for garbage collection. While in one embodiment, the time period is 24 hours, in alternate embodiments, the time period can be shorter or longer.

Figure 5:
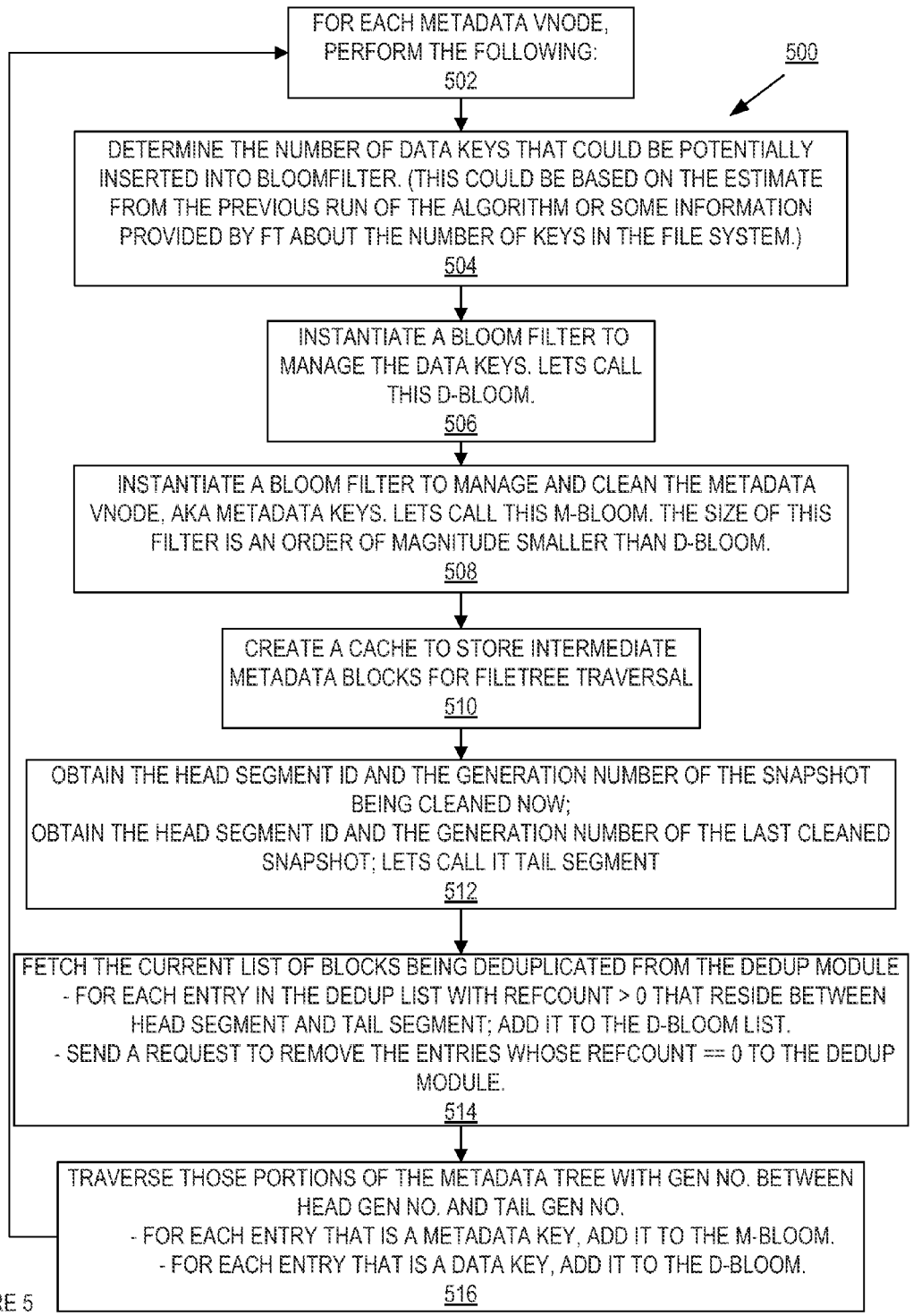
FIG. 5 is a flow diagram of one embodiment of a process to perform an incremental metadata tree walk for garbage collection.

FIG. 5 is a flow diagram of a process to perform an incremental metadata tree walk for garbage collection. In one embodiment, the garbage collection module 304 performs process 500. In FIG. 5, process 500 begins by performing a processing loop (block 502-518) to incrementally walk the metadata tree for each metadata vNode. At block 504, process 500 determines the number of data keys that could be potentially inserted into a bloom filter. In one embodiment, the number of data keys that could be inserted is based on an estimate from the previous run of the algorithm or some information provided by the FT about the number of keys in the File System. At block 506, process 500 instantiates a bloom filter to manage the data keys. In one embodiment, this bloom filter is called the D-Bloom. Process 500 instantiates a bloom filter to manage and clean the Metadata vNode, which includes the metadata keys at block 508. In one embodiment, this metadata bloom filter is called the M-bloom. In one embodiment, the size of the M-bloom is up to an order of magnitude smaller that the D-bloom bloom filter.

At block 510, process 500 creates a cache to store intermediate metadata blocks for filetree traversal. Process 500 obtains a head segment ID and the generation number of the snapshot being cleaned now at block 512. In one embodiment, the head segment ID and the generation number are recorded along with other snapshot attributes when the snapshot is written to the persistent storage. Process 500 obtains the head segment ID and the generation number from the snapshot attributes. In addition, process 500 obtains the head segment ID and the generation number of the last cleaned snapshot. In one embodiment, the head segment ID of the last cleaned snapshot is called the tail segment.

At block 514, process 500 fetches the current list of blocks being deduplicated. In one embodiment, process 500 fetches this list from the deduplication module. In one embodiment, at block 514, process 500 further, for each entry in the deduplication list with a reference count greater than zero that resides between Head Segment and Tail Segment, adds that entry to the D-Bloom list. In addition, process 500, for each entry with a reference count that is equal to zero, removes that entries. In one embodiment, process 500 removes the entry by sending a request to the deduplication module.

Process 500 traverse those portions of the metadata tree with a generation number that is between the head generation number and the tail generation number. During the traverse, is the entry is a metadata key, process 500 adds that entry to the M-Bloom bloom filter. If the entry is data key, process 500 adds that entry to the D-Bloom bloom filter.

In one embodiment, the incremental cleaner cleanses this last category of the segments/objects. In order to achieve this, the StorFS system stores a "generation number" in the metadata tree for each object it writes. The incremental cleaner traverses those portions of the metadata tree whose generation number that is greater than the last generation number it cleaned and populated the live object map. In this embodiment, the segment cleaner cleanses those segments that were written during that time interval. In one embodiment, a system administrator can configure when an incremental full cleaners are ran. For example and in one embodiment, a system administrator may set policies to run the incremental cleaner on weekdays and full cleaner on weekends.

Figure 7:
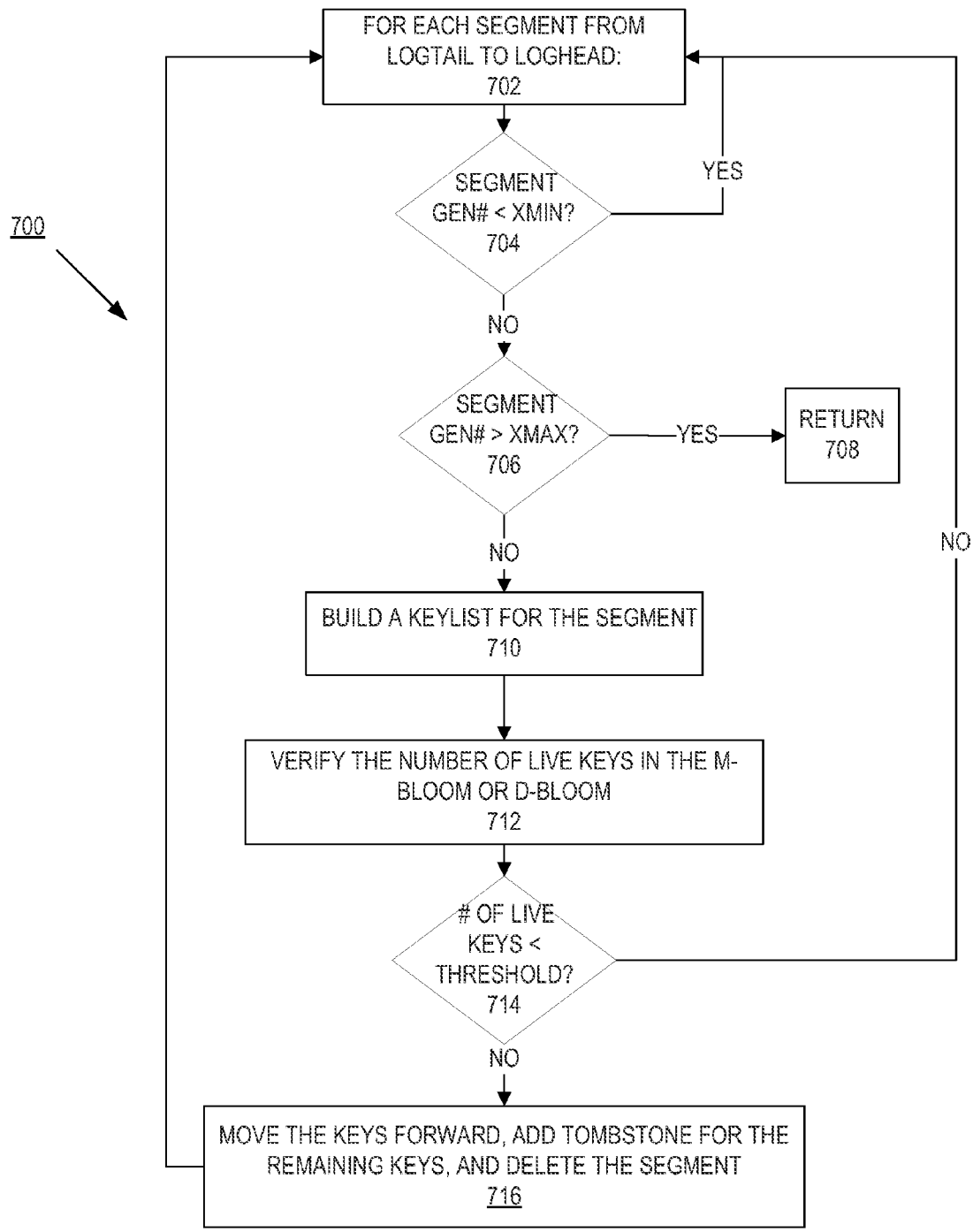
FIG. 7 is a flow diagram of one embodiment of a process to compact segments.

As described above, the garbage collection module 304 compacts segments that have low utilization. FIG. 7 is a flow diagram of one embodiment of a process 700 to compact segments. In one embodiment, process 700 is performed by a process to compact segments, such as process 350 as described in FIG. 3, block 356 above. In one embodiment, process 700 begins by performing a processing loop (blocks 702-716) to compact segments for each segment between $\log_{tail}$ and $\log_{head}$ of a vNode. In one embodiment, process 700 analyzes each of these segments to determine which of the segments has low utilization of live objects. At block 704, process 700 determines if the segment generation number is less than $X_{min}$. In one embodiment, process 700 analyzes segments that are between values $X_{min}$ and $X_{max}$. If the segment generation number is less than $X_{min}$, process 700 proceeds to block 700 to analyze another segment. If the segment generation number is greater than or equal to $X_{min}$, process 700 further determines if the segment generation number is greater than $X_{max}$ at block 706. If the segment generation number is greater than $X_{max}$, process 700 returns. If the segment generation number is less than or equal to than $X_{max}$, process 700 builds a keylist for the segment at block 710. In one embodiment, by building a keylist, process 700 can verify if the keys represent live or dead objects for that segment.

At block 712, process 700 verifies the number of live keys in the live object map. In one embodiment, the live object map is a probabilistic data structure such as a bloom filter as described above. In one embodiment, process 700 verifies the number of live keys in the M-Bloom or D-Bloom filter. For example and in one embodiment, if the vNode is a metadata vNode, process 700 verifies the number of live keys in the M-Bloom filter for this metadata vNode. As another example and embodiment, if the vNode is a data vNode, process 700 verifies the number of live keys in the D-Bloom filter for this data vNode. In one embodiment, process 700 verifies the number of live keys by querying the live object map for membership of each key. If the key is present process 700 counts the key as live and increments the count. If not, process 700 determines the key are dead. With the number of live keys determined, process 700 determines if the number of live keys is less than a threshold at block 714. In one embodiment, the threshold is the number of live keys that represents a low utilization for that segment. If a segment has a low utilization, the objects for that segment can be moved to another segment and this segment can be deleted. If the number of live keys is greater than or equal to the threshold, process 700 proceeds to block 700 to analyze another segment. If the number of live keys is less than the threshold, process deletes the segment at block 716. In one embodiment, process 700 deletes the segment by moving the keys for this segment forward, adding a tombstone for the remaining keys, and deleting the segment. In one embodiment, by deleting the segment, the storage taken up by this segment is freed and can be used for other segments and/or storage.

In one embodiment, each segment can contain four types of entities: Live objects, dead objects, object tombstone entry, and segment tombstone entry. Process 700 handles these entities as follows at block 716: tombstone entries are discarded and need not be carried forward; live objects are copy forwarded to the new segments and the corresponding index for that object is updated; a tombstone entry is added for each dead objects; and a segment tombstone is added for the segment being compacted. Execution proceeds to block 702

Figure 8:
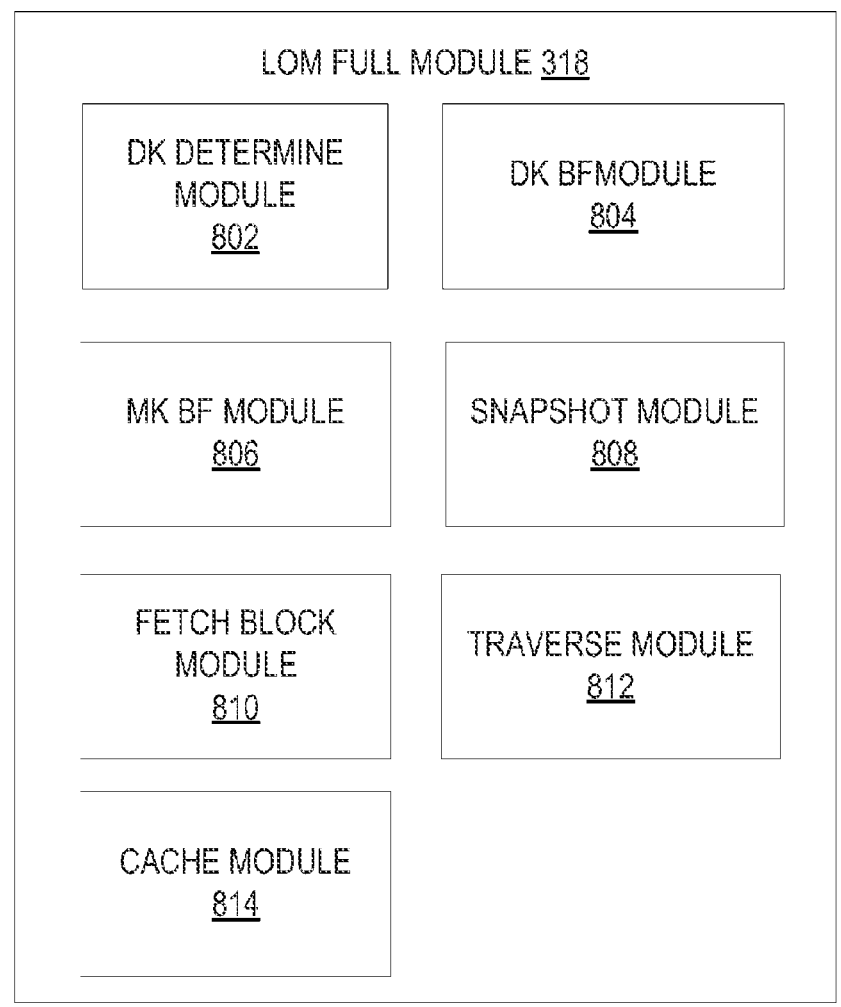
FIG. 8 is a block diagram of one embodiment of a live object map full module that performs a full metadata tree walk for garbage collection.

FIG. 8 is a block diagram of one embodiment of a live object map full module 318 that performs a full metadata tree walk for garbage collection. In one embodiment, the live object map full module includes a data key determine module 802, data key bloom filter module 804, metadata key bloom filter module 806, snapshot module 808, fetch block module 810, traverse module 812, and cache module 814. In one embodiment, the data key determine module 802 determines the number of data keys potentially used as described above in FIG. 4, block 404. The data key bloom filter module 804 instantiates a data key bloom filter as described above in FIG. 4, block 406. The metadata key bloom filter module 806 instantiates a data key bloom filter as described above in FIG. 4, block 408. The snapshot module 808 obtains a head and tail of a snapshot as described above in FIG. 4, block 412. The fetch block module 810 fetches the current blocks as described above in FIG. 4, block 414. The traverse module 812 traverses the metadata tree as described above in FIG. 4, block 416. The cache module 814 creates a cache store as described above in FIG. 4, block 410.

Figure 9:
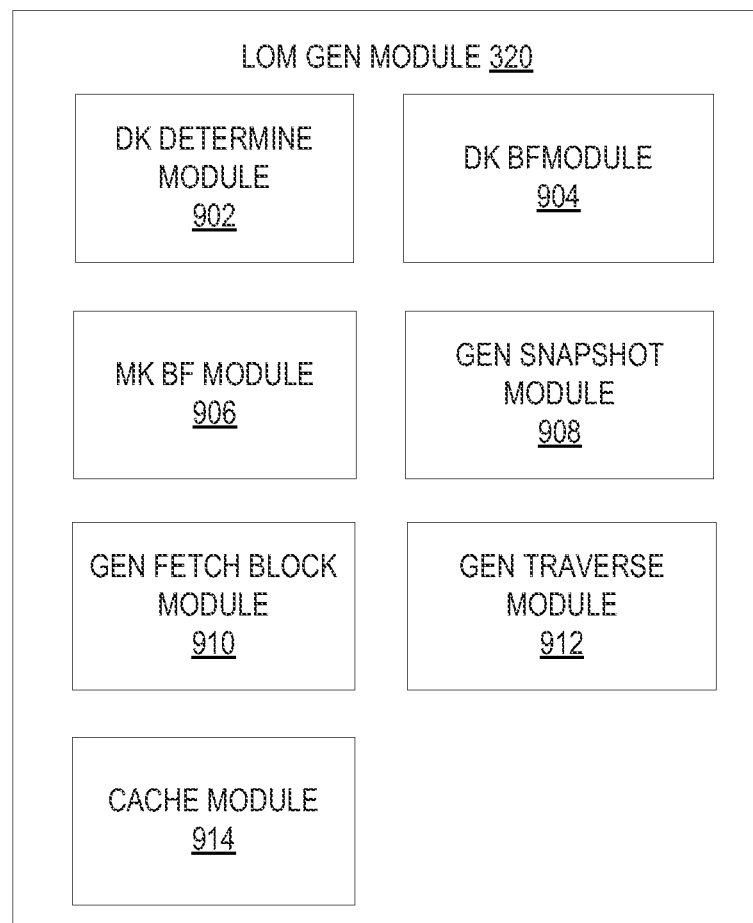
FIG. 9 is a block diagram of one embodiment of a live object map generation module that performs an incremental metadata tree walk for garbage collection.

FIG. 9 is a block diagram of one embodiment of a live object map generation module 320 that performs an incremental metadata tree walk for garbage collection. In one embodiment, the live object map full module includes a data key determine module 902, data key bloom filter module 904, metadata key bloom filter module 906, generation snapshot module 908, generation fetch block module 910, traverse module 912, and cache module 914. In one embodiment, the data key determine module 902 determines the number of data keys potentially used as described above in FIG. 5, block 504. The data key bloom filter module 904 instantiates a data key bloom filter as described above in FIG. 5, block 506. The metadata key bloom filter module 906 instantiates a data key bloom filter as described above in FIG. 5, block 508. The generation snapshot module 908 obtains a head and tail of a snapshot for a generation as described above in FIG. 5, block 512. The generation fetch block module 910 fetches the current blocks for a generation as described above in FIG. 5, block 514. The generation traverse module 912 traverses the metadata tree for a generation as described above in FIG. 5, block 516. The cache module 914 creates a cache store as described above in FIG. 5, block 510.

Figure 10:
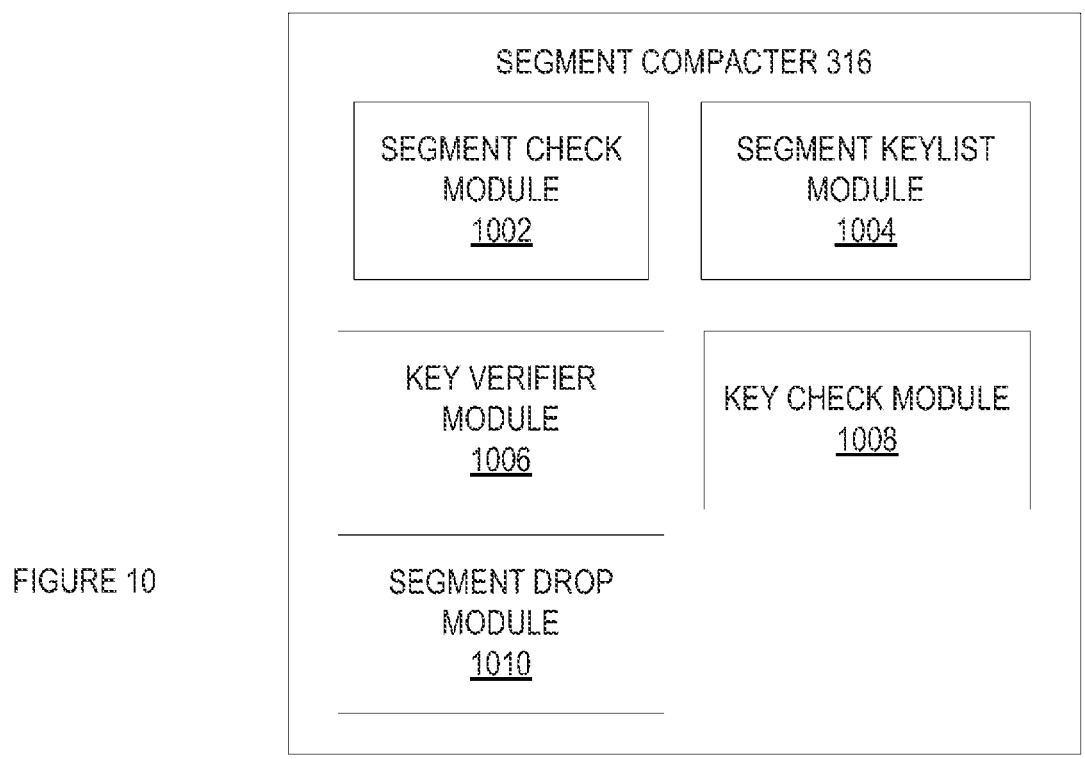
FIG. 10 is a block diagram of one embodiment of a segment compacter that compacts segments.

FIG. 10 is a block diagram of one embodiment of a segment compacter 316 that compacts segments. In one embodiment, the segment compacter 316 includes a segment check module 1002, segment keylist module 1004, key verifier module 1006, key check module 1008, segment drop module 1010. In one embodiment, the segment check module 1002 checks the segment as described above in FIG. 7, blocks 704 and 708. The segment keylist module 1004 builds a keylist for the segment as described above in FIG. 7, block 710. The key verifier module 1006 verifies the number of live keys as described above in FIG. 7, block 712. The key check module 1008 checks if the segment has less than threshold of live keys as described above in FIG. 7, block 714. The segment drop module 1010 drops the segment as described above in FIG. 7, block 716.

Figure 11:
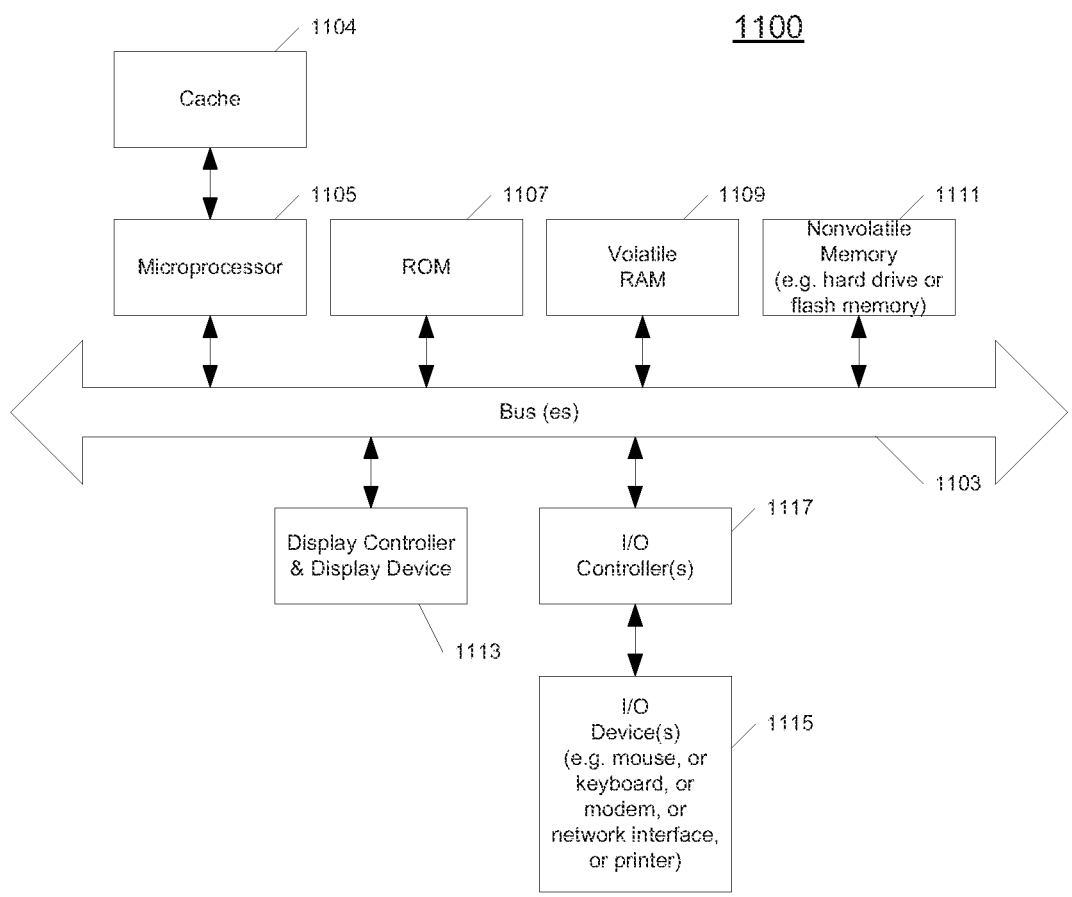
FIG. 11 illustrates one example of a typical computer system, which may be used in conjunction with the embodiments described herein.

FIG. 11 shows one example of a data processing system 1100, which may be used with one embodiment of the present invention. For example, the system 1100 may be implemented including a physical server 102A-C as shown in FIG. 1. Note that while FIG. 11 illustrates various components of a computer system, it is not intended to represent any particular architecture or manner of interconnecting the components as such details are not germane to the present invention. It will also be appreciated that network computers and other data processing systems or other consumer electronic devices, which have fewer components or perhaps more components, may also be used with the present invention.

As shown in FIG. 11, the computer system 1100, which is a form of a data processing system, includes a bus 1103 which is coupled to a microprocessor(s) 1105 and a ROM (Read Only Memory) 1107 and volatile RAM 1109 and a non-volatile memory 1111. The microprocessor 1105 may retrieve the instructions from the memories 1107, 1109, 1111 and execute the instructions to perform operations described above. The bus 1103 interconnects these various components together and also interconnects these components 1105, 1107, 1109, and 1111 to a display controller and display device 1113 and to peripheral devices such as input/output (I/O) devices which may be mice, keyboards, modems, network interfaces, printers and other devices which are well known in the art. Typically, the input/output devices 1115 are coupled to the system through input/output controllers 1117. The volatile RAM (Random Access Memory) 1109 is typically implemented as dynamic RAM (DRAM), which requires power continually in order to refresh or maintain the data in the memory.

The mass storage 1111 is typically a magnetic hard drive or a magnetic optical drive or an optical drive or a DVD RAM or a flash memory or other types of memory systems, which maintain data (e.g. large amounts of data) even after power is removed from the system. Typically, the mass storage 1111 will also be a random access memory although this is not required. While FIG. 11 shows that the mass storage 1111 is a local device coupled directly to the rest of the components in the data processing system, it will be appreciated that the present invention may utilize a non-volatile memory which is remote from the system, such as a network storage device which is coupled to the data processing system through a network interface such as a modem, an Ethernet interface or a wireless network. The bus 1103 may include one or more buses connected to each other through various bridges, controllers and/or adapters as is well known in the art.

Portions of what was described above may be implemented with logic circuitry such as a dedicated logic circuit or with a microcontroller or other form of processing core that executes program code instructions. Thus processes taught by the discussion above may be performed with program code such as machine-executable instructions that cause a machine that executes these instructions to perform certain functions. In this context, a "machine" may be a machine that converts intermediate form (or "abstract") instructions into processor specific instructions (e.g., an abstract execution environment such as a "process virtual machine" (e.g., a Java Virtual Machine), an interpreter, a Common Language Runtime, a high-level language virtual machine, etc.), and/or, electronic circuitry disposed on a semiconductor chip (e.g., "logic circuitry" implemented with transistors) designed to execute instructions such as a general-purpose processor and/or a special-purpose processor. Processes taught by the discussion above may also be performed by (in the alternative to a machine or in combination with a machine) electronic circuitry designed to perform the processes (or a portion thereof) without the execution of program code.

The present invention also relates to an apparatus for performing the operations described herein. This apparatus may be specially constructed for the required purpose, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), RAMs, EPROMs, EEPROMs, magnetic or optical cards, or any type of media suitable for storing electronic instructions, and each coupled to a computer system bus.

A machine readable medium includes any mechanism for storing or transmitting information in a form readable by a machine (e.g., a computer). For example, a machine readable medium includes read only memory ("ROM"); random access memory ("RAM"); magnetic disk storage media; optical storage media; flash memory devices; etc.

An article of manufacture may be used to store program code. An article of manufacture that stores program code may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code may also be downloaded from a remote computer (e.g., a server) to a requesting computer (e.g., a client) by way of data signals embodied in a propagation medium (e.g., via a communication link (e.g., a network connection)).

The preceding detailed descriptions are presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "determining," "transmitting," "computing," "detecting," "performing," "generating," "communicating," "reading," "writing," "transferring," "updating," "scanning," "compacting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will be evident from the description below. In addition, the present invention is not described with reference to any particular programming language. It will be appreciated that a variety of programming languages may be used to implement the teachings of the invention as described herein.

The foregoing discussion merely describes some exemplary embodiments of the present invention. One skilled in the art will readily recognize from such discussion, the accompanying drawings and the claims that various modifications can be made without departing from the spirit and scope of the invention.

What is claimed is:

1. A non-transitory machine-readable medium having executable instructions to cause one or more processing units to perform a method to garbage collect in a distributed storage system, the method comprising:
   generating a live object map of live objects stored on the distributed storage system in a plurality of block segments distributed across a plurality of storage controller servers, wherein the live object map is a probabilistic data structure storing a list of valid objects;
   scanning the plurality of block segments to generate segment summary statistics, wherein the segment summary statistics indicates the number of live objects stored in the plurality of block segments; and
   compacting each of the plurality of block segments that have a low utilization based on the segment summary statistics.

2. The non-transitory machine-readable medium of claim 1, wherein the probabilistic data structure is a bloom filter.

3. The non-transitory machine-readable medium of claim 1, wherein the generating the live object map comprises:
   traversing a metadata tree; and
   adding an object to the live object map for each entry in the metadata tree.

4. The non-transitory machine-readable medium of claim 1, wherein generating the live object map comprises:
   adding list of objects being deduplicated to the live object map.

5. The non-transitory machine-readable medium of claim 1, wherein the generating the live object map comprises:
   traversing a metadata tree for entry having the same generation number; and
   adding an object to the live object map for each entry in the metadata tree.

6. The non-transitory machine-readable medium of claim 1, wherein the scanning comprises:
   building a keylist for the segment; and
   verifying the number of live keys in the live object map.

7. The non-transitory machine-readable medium of claim 1, wherein the compacting comprises:
   moving live keys of the segment forward;
   adding a tombstone for remaining keys of the segment; and
   deleting the segment.

8. A computerized method that garbage collects in a distributed storage system, the method comprising:
   generating a live object map of live objects stored on the distributed storage system in a plurality of block segments distributed across a plurality of storage controller servers, wherein the live object map is a probabilistic data structure storing a list of valid objects;
   scanning the plurality of block segments to generate segment summary statistics, wherein the segment summary statistics indicates the number of live objects stored in the plurality of block segments; and
   compacting each of the plurality of block segments that have a low utilization based on the segment summary statistics.

9. The computerized method of claim 8, wherein the probabilistic data structure is a bloom filter.

10. The computerized method of claim 8, wherein the generating the live object map comprises:
    traversing a metadata tree; and
    adding an object to the live object map for each entry in the metadata tree.

11. The computerized method of claim 8, wherein generating the live object map comprises:
    adding list of objects being deduplicated to the live object map.

12. The computerized method of claim 8, wherein the generating the live object map comprises:
    traversing a metadata tree for entry having the same generation number; and
    adding an object to the live object map for each entry in the metadata tree.

13. The computerized method of claim 8, wherein the scanning comprises:
    building a keylist for the segment; and
    verifying the number of live keys in the live object map.

14. The computerized method of claim 8, wherein the compacting comprises:
    moving live keys of the segment forward;
    adding a tombstone for remaining keys of the segment; and
    deleting the segment.

15. A distributed storage system to garbage collect in a distributed storage system, the distributed storage system comprising:
    an interconnection network; and
    a plurality of storage controllers, interconnected by the interconnection network, wherein each of the plurality of storage controllers includes,
        a garbage collection module that performs garbage collection in the distributed storage system, the garbage collection module including,
            a live object map module that generates a live object map of live objects stored on the distributed storage system in a plurality of block segments distributed across a plurality of storage controller servers, wherein the live object map is a probabilistic data structure storing a list of valid objects;
            a segment cleaner, coupled to the live object map, that scans the plurality of block segments to generate segment summary statistics, wherein the segment summary statistics indicates the number of live objects stored in the plurality of block segments; and
            segment compacter, coupled to the segment cleaner, that compacts each of the plurality of block segments that have a low utilization based on the segment summary statistics.

16. The distributed storage system of claim 15, wherein the probabilistic data structure is a space-efficient approximate membership data-structure.

17. The distributed storage system of claim 15, wherein segment compacter includes a segment drop module that moves live keys of the segment forward, adds a tombstone for remaining keys of the segment, and deletes the segment.

18. A non-transitory machine-readable medium having executable instructions to cause one or more processing units to perform a method to garbage collect in a distributed storage system, the method comprising:
    generating a live object map of live objects stored on the distributed storage system in a plurality of block segments distributed across a plurality of storage controller servers, wherein the generating the live object includes,
        traversing a metadata tree, and
        adding an object to the live object map for each entry in the metadata tree;
    scanning the plurality of block segments to generate segment summary statistics, wherein the segment summary statistics indicates the number of live objects stored in the plurality of block segments; and
    compacting each of the plurality of block segments that have a low utilization based on the segment summary statistics.

19. A non-transitory machine-readable medium having executable instructions to cause one or more processing units to perform a method to garbage collect in a distributed storage system, the method comprising:
    generating a live object map of live objects stored on the distributed storage system in a plurality of block segments distributed across a plurality of storage controller servers, wherein the generating the live object includes,
        adding list of objects being deduplicated to the live object map;
    scanning the plurality of block segments to generate segment summary statistics, wherein the segment summary statistics indicates the number of live objects stored in the plurality of block segments; and
    compacting each of the plurality of block segments that have a low utilization based on the segment summary statistics.

20. A non-transitory machine-readable medium having executable instructions to cause one or more processing units to perform a method to garbage collect in a distributed storage system, the method comprising:
  generating a live object map of live objects stored on the distributed storage system in a plurality of block segments distributed across a plurality of storage controller servers;
  scanning the plurality of block segments to generate segment summary statistics, wherein the segment summary statistics indicates the number of live objects stored in the plurality of block segments, wherein the scanning includes,
    building a keylist for the segment; and
    verifying the number of live keys in the live object map; and
  compacting each of the plurality of block segments that have a low utilization based on the segment summary statistics.

\* \* \* \* \*